US006814642B2

(12) United States Patent
Siwinski et al.

(10) Patent No.: US 6,814,642 B2
(45) Date of Patent: Nov. 9, 2004

(54) TOUCH SCREEN DISPLAY AND METHOD OF MANUFACTURE

(75) Inventors: Michael J. Siwinski, Rochester, NY (US); Kathleen Kilmer, Penfield, NY (US); Rodney Feldman, Rochester, NY (US); Andre D. Cropper, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 445 days.

(21) Appl. No.: 09/911,274

(22) Filed: Jul. 23, 2001

(65) Prior Publication Data

US 2002/0167270 A1 Nov. 14, 2002

Related U.S. Application Data

(63) Continuation-in-part of application No. 09/826,194, filed on Apr. 4, 2001, now abandoned.

(51) Int. Cl.[7] .................................................. H01J 9/00
(52) U.S. Cl. ....................................................... 445/24
(58) Field of Search .............. 445/24, 25; 313/503–506

(56) References Cited

U.S. PATENT DOCUMENTS

| | | | | |
|---|---|---|---|---|
| 4,220,815 A | * | 9/1980 | Gibson et al. ........... | 178/18.05 |
| 5,457,289 A | | 10/1995 | Huang et al. | |
| 5,648,643 A | * | 7/1997 | Knowles et al. ........ | 178/18.04 |
| 5,650,597 A | | 7/1997 | Redmayne | |
| 5,688,551 A | | 11/1997 | Littman et al. | |
| 5,703,436 A | | 12/1997 | Forrest et al. | |
| 5,834,893 A | | 11/1998 | Bulovic et al. | |
| 5,852,487 A | | 12/1998 | Fujimori et al. | |
| 5,982,004 A | | 11/1999 | Sin et al. | |
| 5,995,172 A | | 11/1999 | Ikeda et al. | |
| 6,028,581 A | | 2/2000 | Umeya | |
| 6,035,180 A | * | 3/2000 | Kubes et al. ............ | 455/575.1 |
| 6,177,918 B1 | | 1/2001 | Colgan et al. | |
| 6,356,029 B1 | * | 3/2002 | Hunter .................... | 315/169.1 |
| 6,424,094 B1 | * | 7/2002 | Feldman ................. | 315/169.3 |

FOREIGN PATENT DOCUMENTS

WO    WO 00/17911    3/2000

OTHER PUBLICATIONS

"IntelliTouch® Surface–Wave Touchscreens", copy from web site of Elo TouchSystems, Inc., 1999.
"Choosing the Right Resistive Touch Screen Design", Information Guide, Dynapro.
S. Smith, "Weighing in on touch technology", *Control Solutions Magazine*, May, 2000, pp. 1–3.
Osgood et al., "Touch Screen Controller Tips", *Burr–Brown Application Bulletin AB–158*, Apr. 2000, pp. 1–9.

* cited by examiner

Primary Examiner—Joseph Williams
(74) Attorney, Agent, or Firm—Thomas H. Close; Andrew J. Anderson

(57) ABSTRACT

A touch screen display, includes an electroluminescent display; a touch screen, and a transparent sheet that functions as an element of both the electroluminescent display and the touch screen.

9 Claims, 8 Drawing Sheets

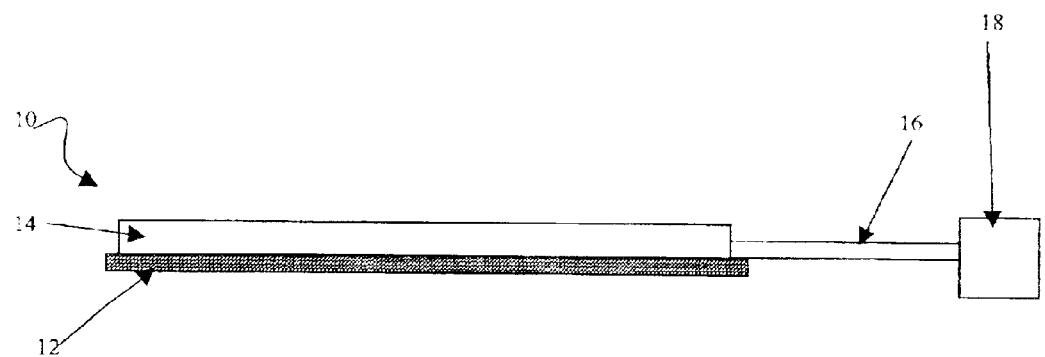
Fig. 1: (Prior art)
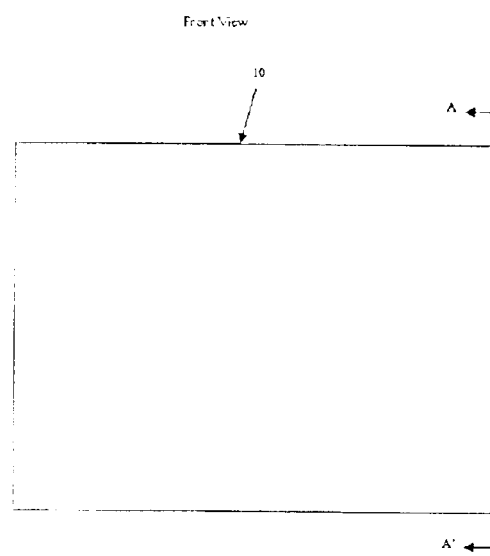
Fig. 2A (Prior art)
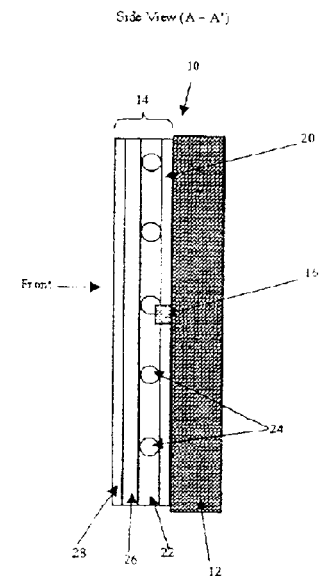
Fig. 2B (Prior art)

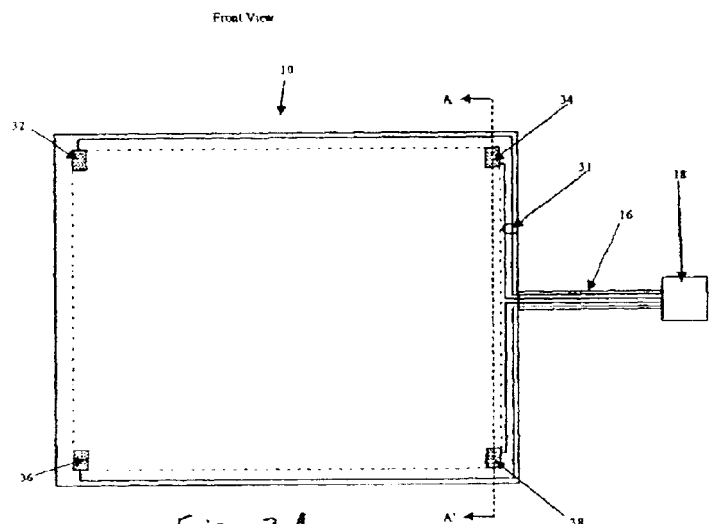
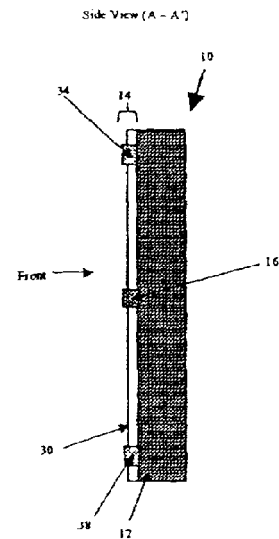
FIG. 3A (PRIOR ART)
FIG. 3B (PRIOR ART)
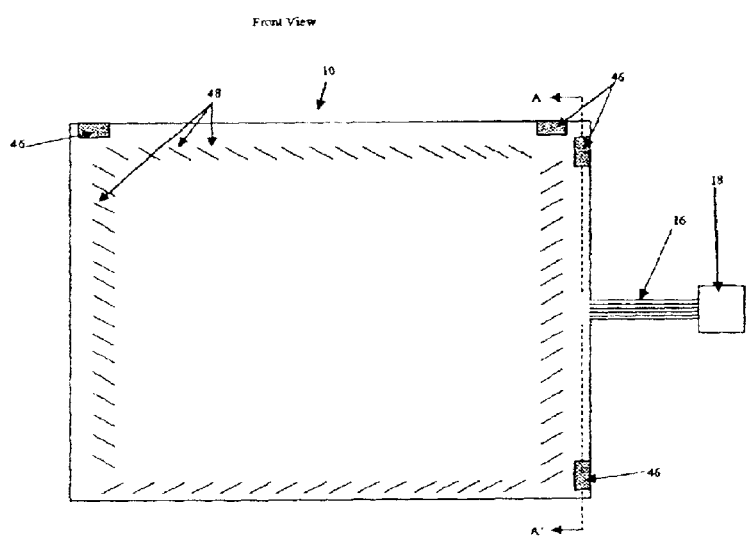
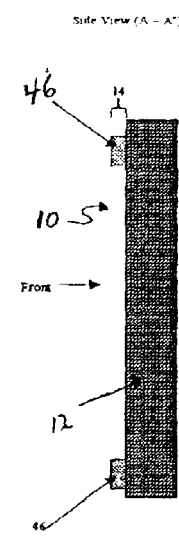
FIG. 4A (PRIOR ART)
FIG. 4B (PRIOR ART)

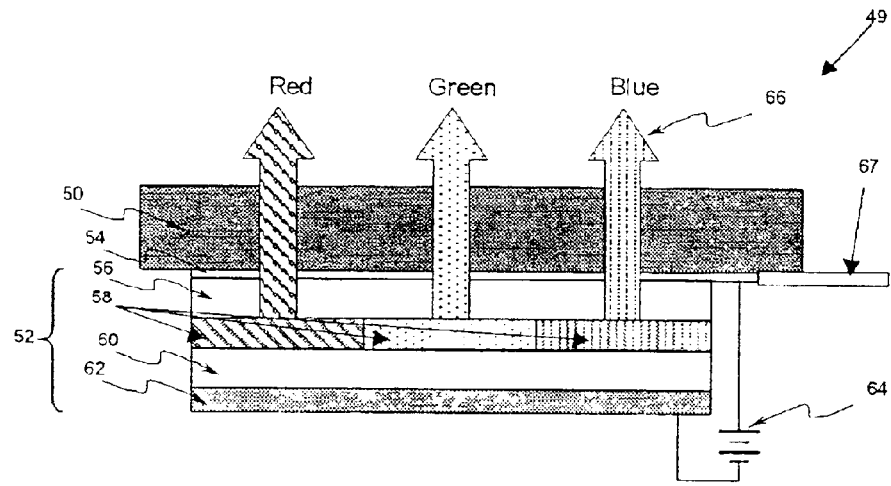
Fig. 5: (Prior art)
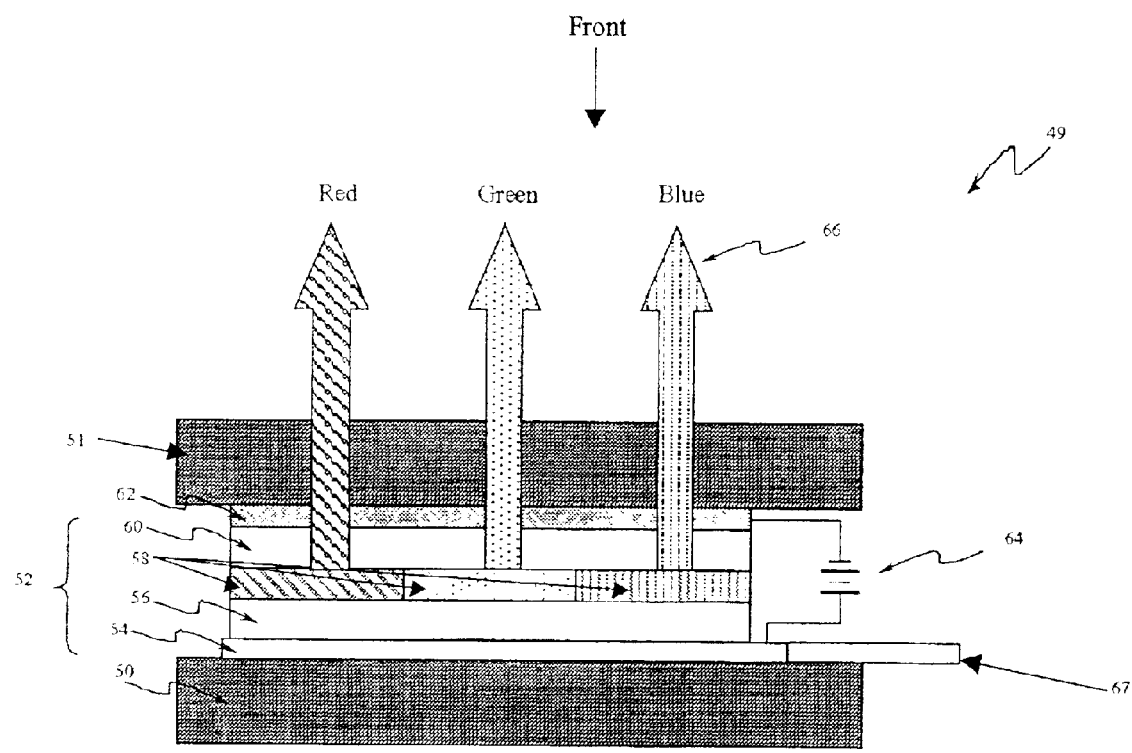
Fig. 6 (Prior art)

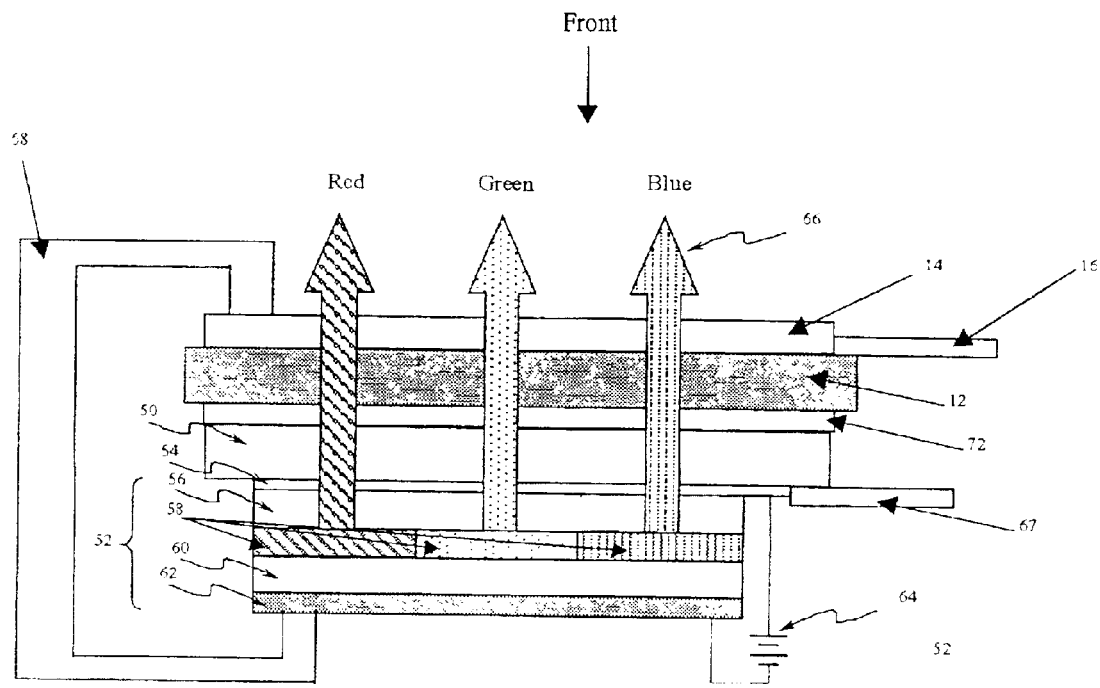
Fig. 7: (Prior art)
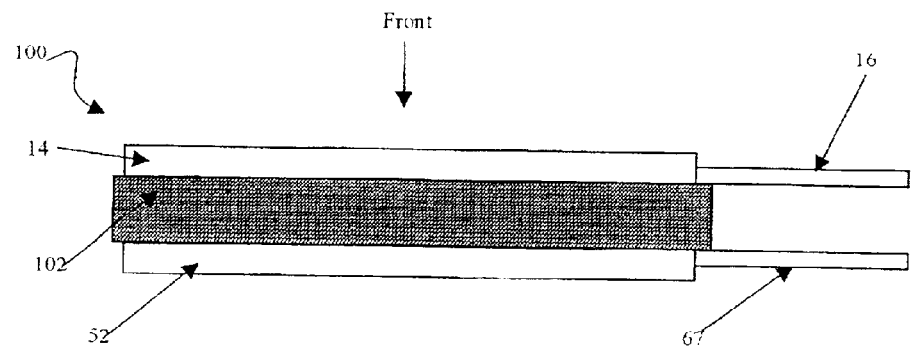
Fig. 8

TOUCH SCREEN DISPLAY AND METHOD OF MANUFACTURE

CROSS REFERENCE TO RELATED APPLICATIONS

This is a continuation-in-part of U.S. patent application Ser. No. 09/826,194 filed Apr. 4, 2001 now ABN, entitled "Organic Electroluminescent Display with Integrated Touch Screen" by Siwinski et al.

FIELD OF THE INVENTION

This invention relates generally to a flat panel display and, more particularly, to a flat panel display with a touch screen.

BACKGROUND OF THE INVENTION

Modern electronic devices provide an increasing amount of functionality with a decreasing size. By continually integrating more and more capabilities within electronic devices, costs are reduced and reliability increased. Touch screens are frequently used in combination with conventional soft displays such as cathode ray tubes (CRTs), liquid crystal displays (LCDs), plasma displays and electroluminescent displays. The touch screens are manufactured as separate devices and mechanically mated to the viewing surfaces of the displays.

FIG. 1 shows a prior art touch screen 10. The touch screen 10 includes a transparent substrate 12. This substrate 12 is typically rigid, and is usually glass, although sometimes a flexible material, such as plastic, is used. Various additional layers of materials forming touch sensitive elements 14 of the touch screen 10 are formed on top of the substrate 12. The touch sensitive elements 14 include transducers and circuitry that are necessary to detect a touch by an object, in a manner that can be used to compute the location of such a touch. A cable 16 is attached to the circuitry so that various signals may be brought onto or off of the touch screen 10. The cable 16 is connected to an external controller 18. The external controller 18 coordinates the application of various signals to the touch screen 10, and performs calculations based on responses of the touch sensitive elements to touches, in order to extract the (X, Y) coordinates of the touch.

There are three commonly used touch screen technologies that utilize this basic structure: resistive, capacitive, and surface acoustic wave (SAW). For more information on these technologies, see "Weighing in on touch technology," by Scott Smith, published in Control Solutions Magazine, May 2000.

There are three types of resistive touch screens, 4-wire, 5-wire, and 8-wire. The three types share similar structures. FIG. 2a shows a top view of a resistive touch screen 10. FIG. 2b shows a side view of the resistive touch screen 10. The touch sensitive elements 14 of the resistive touch screen 10 includes a lower circuit layer 20; a flexible spacer layer 22 containing a matrix of spacer dots 24; a flexible upper circuit layer 26; and a flexible top protective layer 28. All of these layers are transparent. The lower circuit layer 20 often comprises conductive materials deposited on the substrate 12, forming a circuit pattern.

The main difference between 4-wire, 5-wire, and 8-wire touch screens is the circuit pattern in the lower circuit layer 20 and the upper circuit layer 26, and the means for making resistance measurements. An external controller 18 is connected to the touch screen circuitry via cable 16. Conductors in cable 16 are connected to the circuitry within the lower circuit layer 20 and the upper circuit layer 26. The external controller 18 coordinates the application of voltages to the touch screen circuit elements. When a resistive touch screen is pressed, the pressing object, whether a finger, a stylus, or some other object, deforms the top protective layer 28, the upper circuit layer 26, and the spacer layer 22, forming a conductive path at the point of the touch between the lower circuit layer 20 and the upper circuit layer 26. A voltage is formed in proportion to the relative resistances in the circuit at the point of touch, and is measured by the external controller 18 connected to the other end of the cable 16. The controller 18 then computes the (X, Y) coordinates of the point of touch. For more information on the operation of resistive touch screens, see "Touch Screen Controller Tips," Application Bulletin AB-158, Burr-Brown, Inc. (Tucson, Ariz.), April 2000, pages 1–9.

FIG. 3a shows a top view of a capacitive sensing touch screen 10. FIG. 3b shows a side view of the capacitive sensing touch screen 10. The touch sensitive elements 14 include a transparent metal oxide layer 30 formed on substrate 12. Metal contacts 32, 34, 36, and 38 are located on the metal oxide layer 30 at the corners of the touch screen 10. These metal contacts are connected by circuitry 31 to conductors in cable 16. An external controller 18 causes voltages to be applied to the metal contacts 32, 34, 36, and 38, creating a uniform electric field across the surface of the substrate 12, propagated through the transparent metal oxide layer 30. When a finger or other conductive object touches the touch screen, it capacitively couples with the screen causing a minute amount of current to flow to the point of contact, where the current flow from each corner contact is proportional to the distance from the corner to the point of contact. The controller 18 measures the current flow proportions and computes the (X, Y) coordinates of the point of touch. U.S. Pat. No. 5,650,597, issued Jul. 22, 1997 to Redmayne describes a variation on capacitive touch screen technology utilizing a technique called differential sensing.

FIG. 4a shows a top view of a prior art surface acoustic wave (SAW) touch screen 10. FIG. 4b shows a side view of a SAW touch screen 10. The touch sensitive elements 14 include an arrangement of acoustic transducers 46 and sound wave reflectors 48 formed on the face of substrate 12. The sound wave reflectors 48 are capable of reflecting high frequency sound waves that are transmitted along the substrate surface, and are placed in patterns conducive to proper wave reflection. Four acoustic transducers 46 are formed on the substrate 12 and are used to launch and sense sound waves on the substrate surface. A cable 16 is bonded to the substrate 12, and contains conductors that connect the acoustic transducers 46 to an external controller 18. This external controller 18 applies signals to the acoustic transducers 46, causing high frequency sound waves to be emitted across the substrate 12. When an object touches the touch screen, the sound wave field is disturbed. The transducers 46 detect this disturbance, and external controller 18 uses this information to calculate the (X, Y) coordinate of the touch.

FIG. 5 shows a typical prior art electroluminescent display such as an organic light emitting diode OLED flat panel display 49 of the type shown in U.S. Pat. No. 5,688,551, issued Nov. 18, 1997 to Littman et al. The OLED display includes substrate 50 that provides a mechanical support for the display device. The substrate 50 is typically glass, but other materials, such as plastic, may be used. Light-emitting elements 52 include conductors 54, a hole injection layer 56, an organic light emitter 58, an electron transport layer 60 and a metal cathode layer 62. When a voltage is applied by a voltage source 64 across the light emitting elements 52, via cable 67, light 66 is emitted through the substrate 50, or through a transparent cathode layer 62.

The OLED structure described in relation to FIG. 5 is commonly known as a bottom-emitting structure, where light is emitted through the substrate 50, conductors 54, and hole injection layer 56. An alternative OLED structure, known as a top-emitting structure, similar to that described by International Patent WO 00/17911, issued on Mar. 30, 2000 to Pichler, is shown in FIG. 6. Here, light emitting elements 52, including conductors 54, a hole injection layer 56, an organic light emitter 58, an electron transport layer 60 and a metal cathode layer 62, are formed on substrate 50. A transparent cover sheet 51 is then placed above metal cathode layer 62, and is sealed to the substrate 50. In the top-emitting OLED structure, light is emitted by the organic light emitter 58 through the electron transport layer 60, the metal cathode layer 62, and the transparent cover sheet 51. Less light is absorbed or scattered in top-emitting OLEDs, making the device more efficient. Additionally, top-emitting OLEDs often allow for larger pixel fill factors, since the light emitted is not blocked by conductors 54.

Conventionally, when a touch screen is used with a flat panel display, the touch screen is simply placed over the flat panel display, above the surface from which light is emitted, and the two are held together by a mechanical mounting means such as a frame. FIG. 7 shows such a prior art arrangement with a bottom-emitting touch screen mounted on an OLED flat panel display. After the touch screen and the OLED display are assembled, the two substrates 12 and 50 are placed together in a frame 68. Sometimes, a narrow air gap is added between the substrates 12 and 50 by inserting a spacer 72 to prevent Newton rings. The thickness and materials in the substrates can degrade the quality of the image. When light passes from the underlying flat panel display through the touch screen, a change in refractive index occurs. Some light is refracted, some light is transmitted, and some light is reflected. This reduces the brightness and sharpness of the display.

Although FIG. 7 illustrates a conventional mounting means for a touch screen to a bottom-emitting OLED, the same basic method may be used for mounting a touch screen to a top-emitting OLED. Here, the touch screen's substrate 12 is placed together with the transparent cover sheet 51 (not shown) in frame 68. A narrow air gap may be placed between the substrate 12 and the transparent cover sheet 51 by inserting spacer 72. Light emitted by the light emitting elements 52 then passes through the transparent cover sheet 51, through the substrate 12, and through the touch sensitive materials 14.

U.S. Pat. No. 5,982,004 issued Nov. 9, 1999, to Sin et al. describes a thin film transistor that may be useful for flat panel display devices and mentions that touch sensors may be integrated into a display panel. However, Sin et al. do not propose a method for doing so.

U.S. Pat. No. 6,028,581 issued Feb. 22, 2000, to Umeya describes a liquid crystal display with an integrated touch screen on the same face of a substrate to reduce parallax error due to the combined thickness of the liquid crystal display and the touch screen. This arrangement has the shortcoming that the existing pixel array layout must be significantly modified, incurring additional cost and reducing pixel fill factor.

U.S. Pat. No. 5,995,172 issued Nov. 30, 1999, to Ikeda et al. discloses a tablet integrated LCD display apparatus wherein a touch sensitive layer is formed on the same side of a substrate as the LCD.

U.S. Pat. No. 5,852,487 issued Dec. 22, 1998, to Fujimori et al. discloses a liquid crystal display having a resistive touch screen. The display includes three substrates.

U.S. Pat. No. 6,177,918 issued Jan. 23, 2001, to Colgan et al. describes a display device having a capacitive touch screen and LCD integrated on the same side of a substrate.

There remains a need for an improved touch screen-flat panel display system that minimizes device weight, removes redundant materials, decreases cost, eliminates special mechanical mounting design, increases reliability, prevents Newton rings, and minimizes the degradation in image quality.

SUMMARY OF THE INVENTION

The need is met according to the present invention by providing a touch screen display that includes an electroluminescent display; a touch screen, and a transparent sheet that functions as an element of both the electroluminescent display and the touch screen.

ADVANTAGES

The display according to the present invention is advantageous in that it provides a display having a minimum number of substrates, thereby providing a thin, light, easily manufacturable display.

BRIEF DESCRIPTION OF THE DRAWINGS

FIG. 1 is a schematic diagram showing the basic structure of a prior art touch screen;

FIGS. 2a and 2b are schematic diagrams showing the structure of a prior art resistive touch screen;

FIGS. 3a and 3b are schematic diagrams showing the structure of a prior art capacitive touch screen;

FIGS. 4a and 4b are schematic diagrams showing the structure of a prior art surface acoustic wave touch screen;

FIG. 5 is a schematic diagram showing the structure of a prior art bottom-emitting organic electroluminescent display;

FIG. 6 is a schematic diagram showing the structure of a prior art top-emitting organic electroluminescent display;

FIG. 7 is a schematic diagram showing the combination of a touch screen with a flat panel electroluminescent display as would be accomplished in the prior art;

FIG. 8 is a schematic diagram showing the basic structure of a bottom-emitting electroluminescent display with a touch screen according to the present invention.

DETAILED DESCRIPTION OF THE INVENTION

Figure 9:
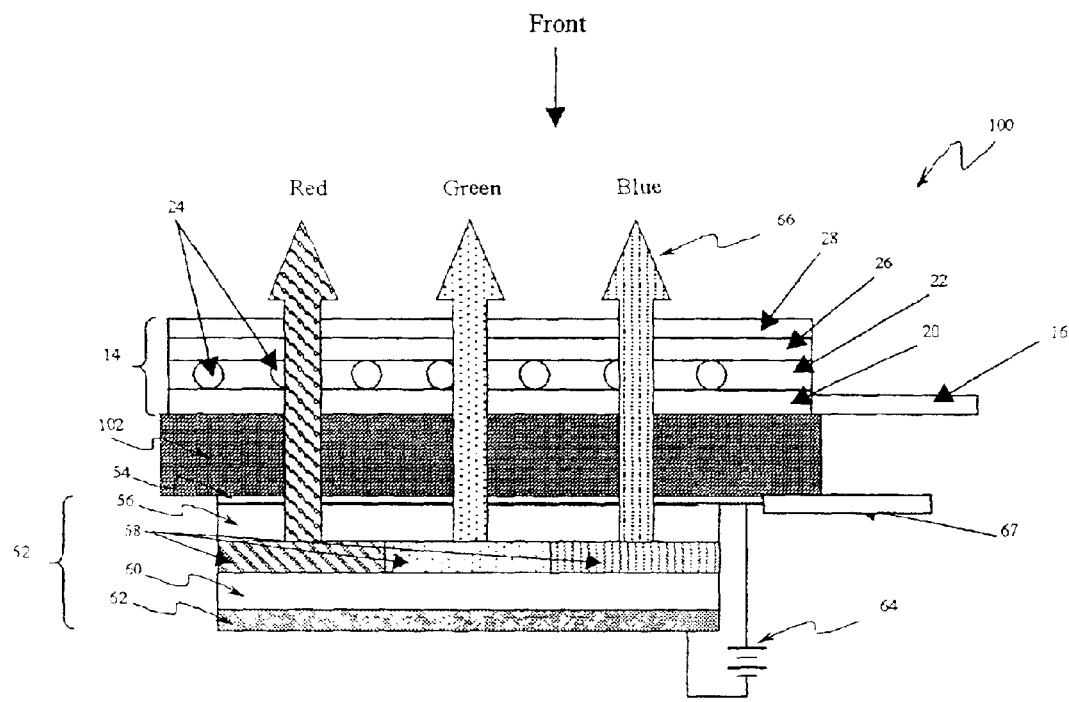
FIG. 9 is a schematic diagram showing an embodiment of the present invention including a resistive touch screen utilizing a bottom-emitting structure.

Referring to FIG. 8, a touch screen display generally designated 100 according to the present invention includes a transparent sheet 102 having light emitting elements 52 of an electroluminescent display formed on one face of the substrate for emitting light through the substrate, in a bottom-emitting structure, and touch sensitive elements 14 of a touch screen formed on the other face of the transparent sheet 102. The transparent sheet 102 is made of a transparent material, such as glass or plastic, and is thick enough to provide mechanical support for both the light emitting elements 52 and the touch sensitive elements 14. This improved display eliminates the need for a second substrate, and allows both the light emitting elements 52 of the image display and the touch sensitive elements 14 to be formed on the same substrate without interfering with each other. This reduces system cost, manufacturing cost, and system integration complexity. Various prior art touch screen technologies may be employed in the touch screen display 100 as described below.

Referring to FIG. 9, a touch screen display 100 including a resistive touch screen according to one embodiment of the present invention utilizing a bottom-emitting structure is shown. A lower circuit layer 20 and metal interconnections 54 are formed, for example by photolithographically patterning respective conductive layers on opposite faces of transparent sheet 102. The conductive layers comprise for example a semitransparent metal, typically ITO. On the image display side of the transparent sheet 102, a hole injection layer (HIL) 56 is applied to the device over the metal interconnections 54. Then organic light emitters 58 are deposited on top of the HIL layer 56. During the deposition stage, the organic material is patterned for individual colors by either shadow masking or other vacuum deposition techniques. Next, an electron transport layer (ETL) 60 is deposited, followed by a metal cathode layer 62. On the touch screen side of the transparent sheet 102, a flexible spacer layer 22 containing a matrix of spacer dots 24 is placed on top of the lower circuit layer 20. A flexible upper circuit layer 26 is then attached to the device over the spacer layer 22. The stack is protected by a flexible top protective layer 28 that is laminated on top of the upper circuit layer 26. A cable 16 is attached to the touch screen elements 14, completing the touch screen portion of the display 100. Finally, a cable 67 is attached to the light emitting elements 52, resulting in a fully manufactured touch screen display 100.

Figure 10:
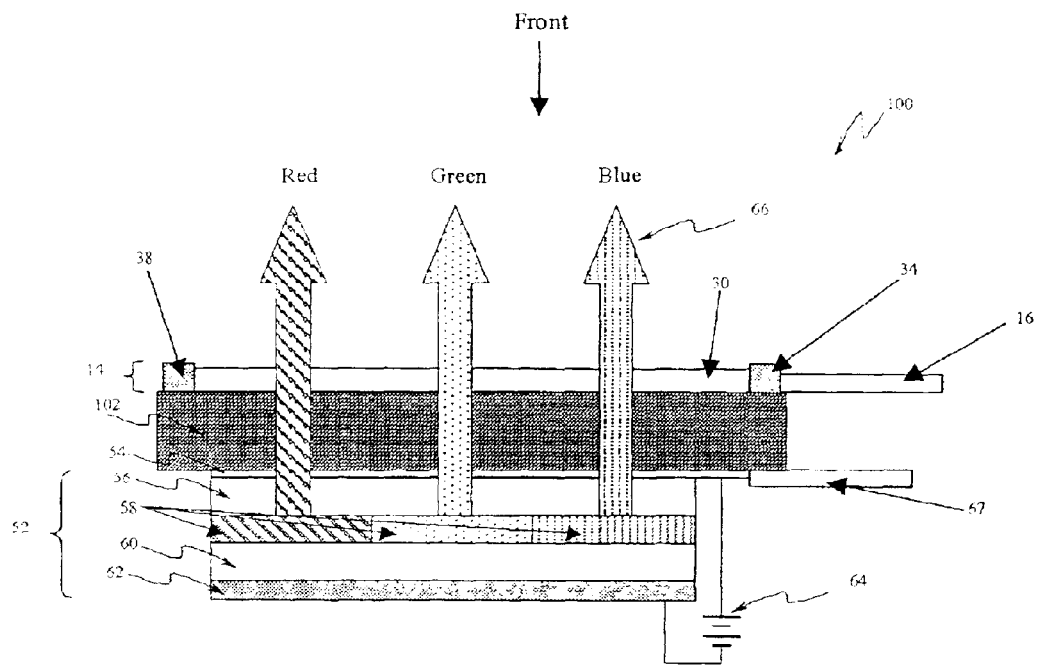
FIG. 10 is a schematic diagram showing an embodiment of the present invention with a capacitive touch screen utilizing a bottom-emitting structure.

FIG. 10 shows a touch screen display 100 with a capacitive touch screen according to the present invention using a bottom-emitting structure. A transparent sheet 102 is coated on one face (the touch screen face) with a transparent metal oxide layer 30. On the other face of the transparent sheet 102, the light emitting elements 52 of an image display are formed. First, metal interconnections 54 are formed on the transparent sheet 102. Next, a hole injection layer (HIL) 56 is applied to the device over the metal interconnections 54. Then organic light emitters 58 are coated and patterned on top of the HIL layer 56. Next, an electron transport layer (ETL) 60 is deposited, followed by a metal cathode layer 62. Metal contacts 32, 34, 36, and 38 are then placed at the corners of the metal oxide layer 30, completing the touch screen elements 14. Finally, a cable 67 is attached to the light emitting elements 52, and a cable 16 is attached to touch screen elements 14, where the conductors of the cable 16 are connected to the metal contacts 32, 34, 36, and 38, resulting in a fully manufactured touch screen display 100.

Figure 11:
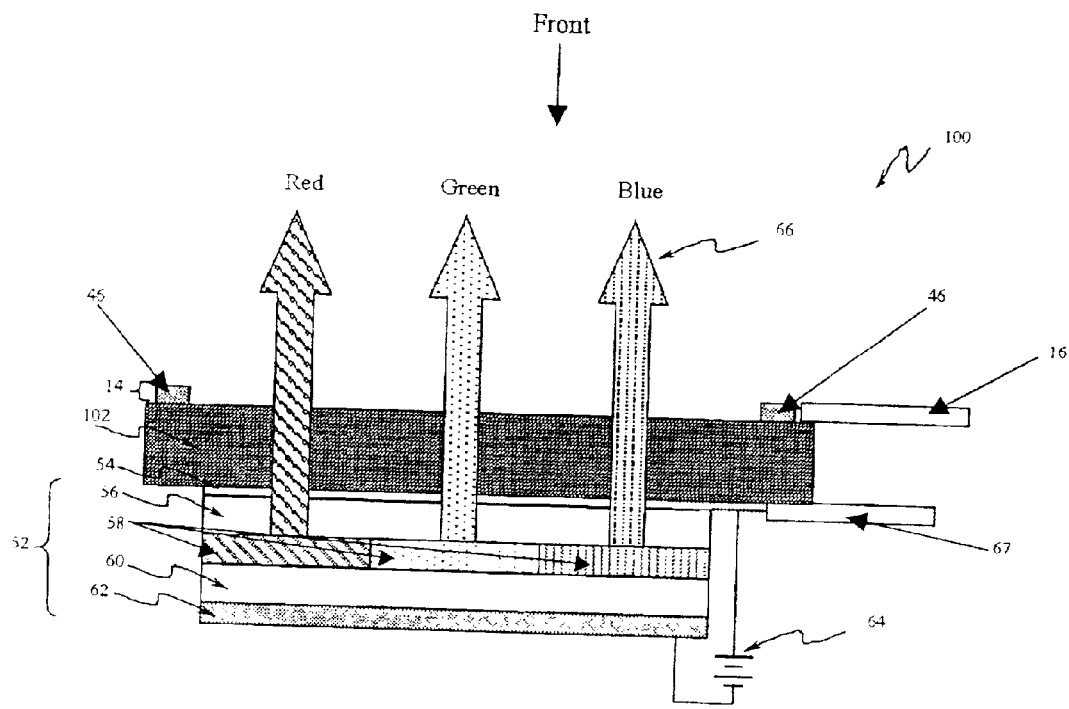
FIG. 11 is a schematic diagram showing an embodiment of the present invention with a surface acoustic wave touch screen utilizing a bottom-emitting structure.

FIG. 11 shows a bottom-emitting touch screen display 100 manufactured with a surface acoustic wave touch screen. A series of acoustic surface wave reflectors 48 are etched into one face of transparent sheet 102. Next, an image display 52 is formed on the opposite face of the transparent sheet 102, started by forming metal interconnections 54. Then, a hole injection layer (HIL) 56 is applied to the device over the metal interconnections 54. Organic emitters 58 are then coated and patterned on top of the HIL layer 56. Next, an electron transport layer (ETL) 60 is deposited, followed by a metal cathode layer 62, completing the light emitting elements 52. The touch screen elements 14 are then completed by forming four acoustic transducers 46 on the transparent sheet 102. Finally, a cable 67 is attached to the light emitting elements 52 of the image display, and a cable 16 is attached to the touch sensitive elements 14 of the touch screen, resulting in a fully manufactured touch screen display 100.

Figure 12:
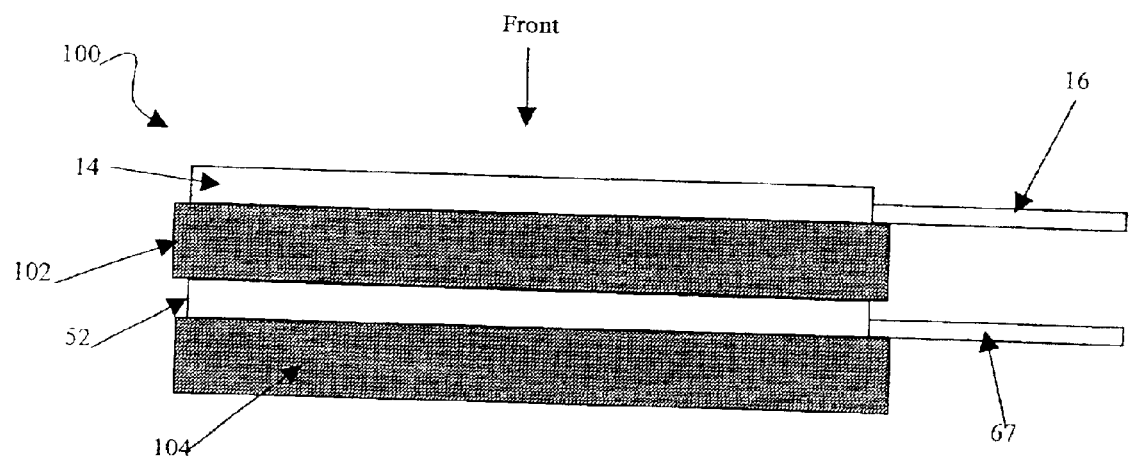
FIG. 12 is a schematic diagram showing the basic structure of a top-emitting electroluminescent display with a touch screen according to the present invention.

FIG. 12 shows the basic structure of the present invention utilizing a top-emitting structure for the electroluminescent display. A touch screen display 100 includes a substrate 104 having light emitting elements 52 of an electroluminescent display formed on one face, and a transparent sheet 102 having touch sensitive elements of a touch screen formed on one face. In this structure, light from the light emitting elements 52 passes through the transparent sheet 102. The transparent sheet 102 is sealed to the substrate 104 along the sides of the two materials, where one face of the transparent sheet 102 is contained within the touch screen display 100, forming a top-emitting structure. Touch sensitive elements 14 of a touch screen formed on the other face of the transparent sheet 102. The transparent sheet 102 is made of a transparent material, such as glass or plastic, and is thick enough to provide mechanical support for the touch sensitive elements 14. A conventional touch screen consists of touch sensitive elements 14 and a transparent material used as a substrate. In the present embodiment, the touch sensitive materials 14 may be formed on the transparent sheet 102 of the touch screen display 100, eliminating the need for an additional material layer for the combined structure. This reduces system cost, manufacturing cost, and system integration complexity. Various prior art touch screen technologies may be employed in the display 100 as described below.

Figure 13:
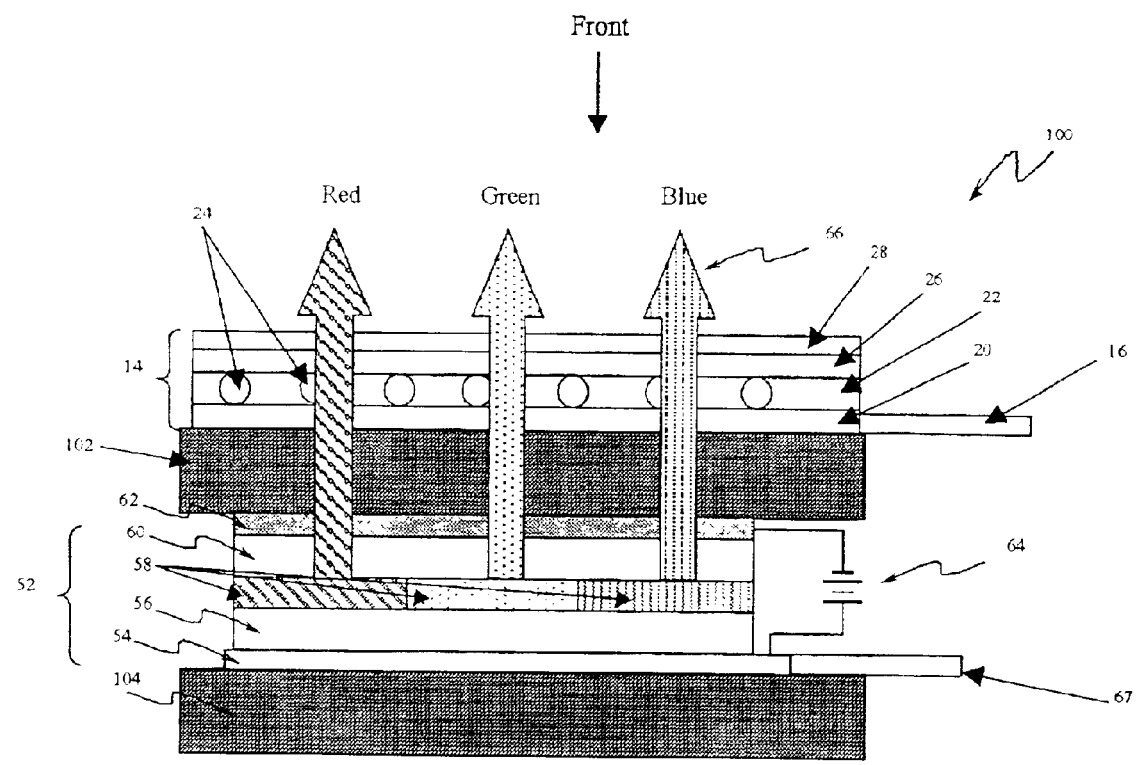
FIG. 13 is a schematic diagram showing an embodiment of the present invention including a resistive touch screen utilizing a top-emitting structure.

Referring to FIG. 13, a touch screen display 100 including a resistive touch screen according to one embodiment of the present invention utilizing a top-emitting structure is shown. Metal interconnections 54 are formed, for example by photolithographically patterning respective conductive layers on one face of substrate 104. A hole injection layer (HIL) 56 is applied to the device over the metal interconnections 54. Then organic light emitters 58 are deposited on top of the HIL layer 56. During the deposition stage, the organic material is patterned for individual colors by either shadow masking or other vacuum deposition techniques. Next, an electron transport layer (ETL) 60 is deposited, followed by a semi-transparent or transparent metal cathode layer 62. Transparent sheet 102 is then sealed to the substrate 104. A lower circuit layer 20 is formed on the face of the transparent sheet 102. Next, a flexible spacer layer 22 containing a matrix of spacer dots 24 is placed on top of the lower circuit layer 20. A flexible upper circuit layer 26 is then attached to the device over the spacer layer 22. The stack is protected by a flexible top protective layer 28 that is laminated on top of the upper circuit layer 26. A cable 16 is attached to the touch screen elements 14, completing the touch screen portion of the touch screen display 100. Finally, a cable 67 is attached to the light emitting elements 52, resulting in a fully manufactured touch screen display 100. This method for producing an integrated touch screen-electroluminescent display device utilizes one sequential manufacturing process, reducing overall time and materials flow problems, and allows for encapsulation of the light emitting elements as quickly as possible, improving yields.

Alternatively, the touch screen display of FIG. 13 may be manufactured in a second manner, where the touch sensitive elements are placed on the transparent sheet 102 prior to encapsulation. In such a process, metal interconnections 54 are formed, for example by photolithographically patterning respective conductive layers on one face of substrate 104. A hole injection layer (HIL) 56 is applied to the device over the metal interconnections 54. Then organic light emitters 58 are deposited on top of the HIL layer 56. During the deposition stage, the organic material is patterned for individual colors by either shadow masking or other vacuum deposition techniques. Next, an electron transport layer (ETL) 60 is deposited, followed by a semi-transparent or transparent metal cathode layer 62. In another location, typically prior to or simultaneous with the above manufacturing steps, the touch sensitive elements 14 are formed on one face of transparent sheet 102. First, a lower circuit layer 20 is formed on the face of the transparent sheet 102. Next, a flexible spacer layer 22 containing a matrix of spacer dots 24 is placed on top of the lower circuit layer 20. A flexible upper circuit layer 26 is then attached to the device over the spacer layer 22. The stack is protected by a flexible top protective layer 28 that is laminated on top of the upper circuit layer 26.

At this point, the substrate 104, the transparent sheet 102, and the materials attached to them, are brought to a common location. The transparent sheet 102 is sealed to the substrate 104, where the light emitting elements 52 are placed between the substrate 104 and the transparent sheet 102, while the face with the touch sensitive elements 14 is placed away from the substrate 104. The touch screen display 100 is now encapsulated. Next, a cable 16 is attached to the touch screen elements 14, completing the touch screen portion of the touch screen display 100. Finally, a cable 67 is attached to the light emitting elements 52, resulting in a fully manufactured touch screen display 100. This method for producing an integrated touch screen-electroluminescent display device decouples the manufacturing of the touchسnsitive elements 14 from the light emitting elements 52. Each structure may then be tested separately, and a defective structure may then be discarded, prior to encapsulation. This improves overall yield, since one defective structure does not require both structures to be discarded.

Figure 14:
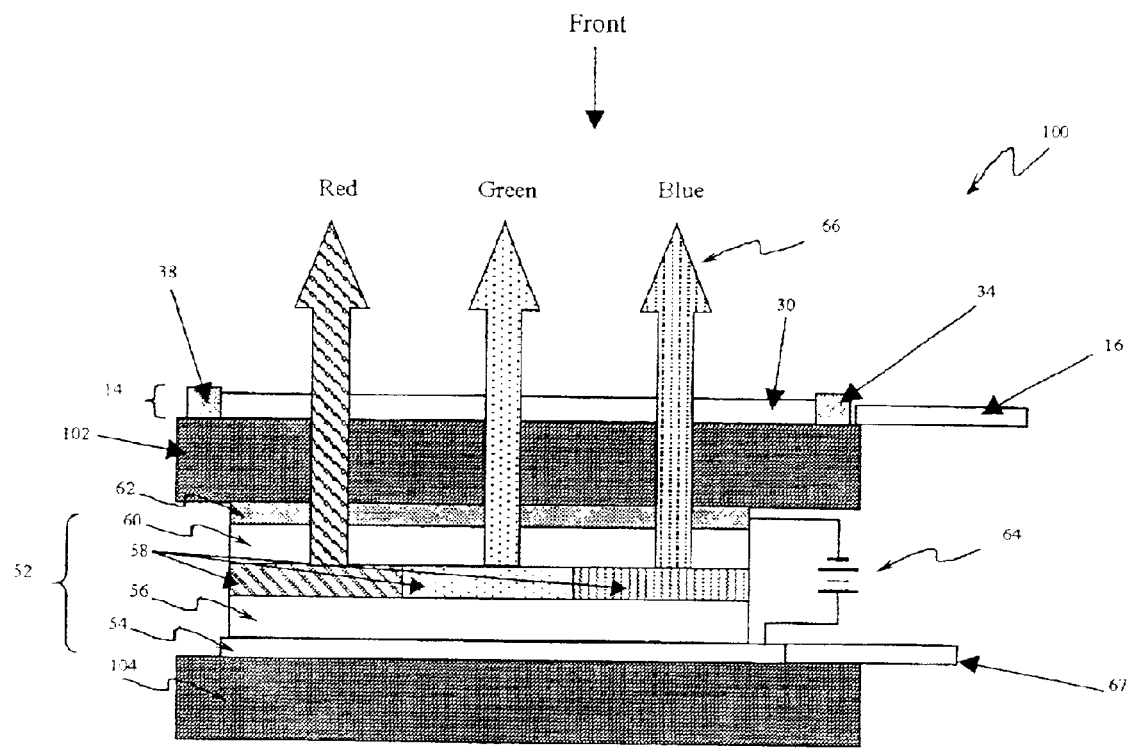
FIG. 14 is a schematic diagram showing an embodiment of the present invention with a capacitive touch screen utilizing a top-emitting structure.

FIG. 14 shows a touch screen display 100 with a capacitive touch screen according to the present invention using a top-emitting structure. According to one method of manufacturing, light emitting elements 52 of an image display are formed on one face of substrate 104. First, metal interconnections 54 are formed on the substrate 104. Next, a hole injection layer (HIL) 56 is applied to the device over the metal interconnections 54. Then organic light emitters 58 are coated and patterned on top of the HIL layer 56. Next, an electron transport layer (ETL) 60 is deposited, followed by a semi-transparent or transparent metal cathode layer 62. Transparent sheet 102 is then sealed to substrate 104, encapsulating the display. Next, a transparent metal oxide layer 30 is coated on the top transparent material. Metal contacts 34, and 38 are then placed at the corners of the metal oxide layer 30, completing the touch screen elements 14. Finally, a cable 67 is attached to the light emitting elements 52, and a cable 16 is attached to touch screen elements 14, where the conductors of the cable 16 are connected to the metal contacts 34, and 38, resulting in a fully manufactured touch screen display 100.

Alternatively, the touch screen display of FIG. 14 may be manufactured in a second manner, where the touch sensitive elements are placed on the transparent sheet 102 prior to encapsulation. In such a process, metal interconnections 54 are formed on one face of the substrate 104. Next, a hole injection layer (HIL) 56 is applied to the device over the metal interconnections 54. Then organic light emitters 58 are coated and patterned on top of the HIL layer 56. Next, an electron transport layer (ETL) 60 is deposited, followed by a semi-transparent or transparent metal cathode layer 62. In another location, typically prior to or simultaneous with the above manufacturing steps, the touch sensitive elements 14 are formed on one face of transparent sheet 102. First, a transparent metal oxide layer 30 is coated on the top transparent material. Metal contacts 34, and 38 are then placed at the corners of the metal oxide layer 30, completing the touch screen elements 14.

At this point, the substrate 104, the transparent sheet 102, and the materials attached to them, are brought to a common location. The transparent sheet 102 is sealed to the substrate 104, where the light emitting elements 52 are placed between the substrate 104 and the transparent sheet 102, while the face with the touch sensitive elements 14 is placed away from the substrate 104. The touch screen display 100 is now encapsulated. Transparent sheet 102 is then sealed to substrate 104, encapsulating the touch screen display. Finally, a cable 67 is attached to the light emitting elements 52, and a cable 16 is attached to touch screen elements 14, where the conductors of the cable 16 are connected to the metal contacts 34, and 38, resulting in a fully manufactured touch screen display 100.

Figure 15:
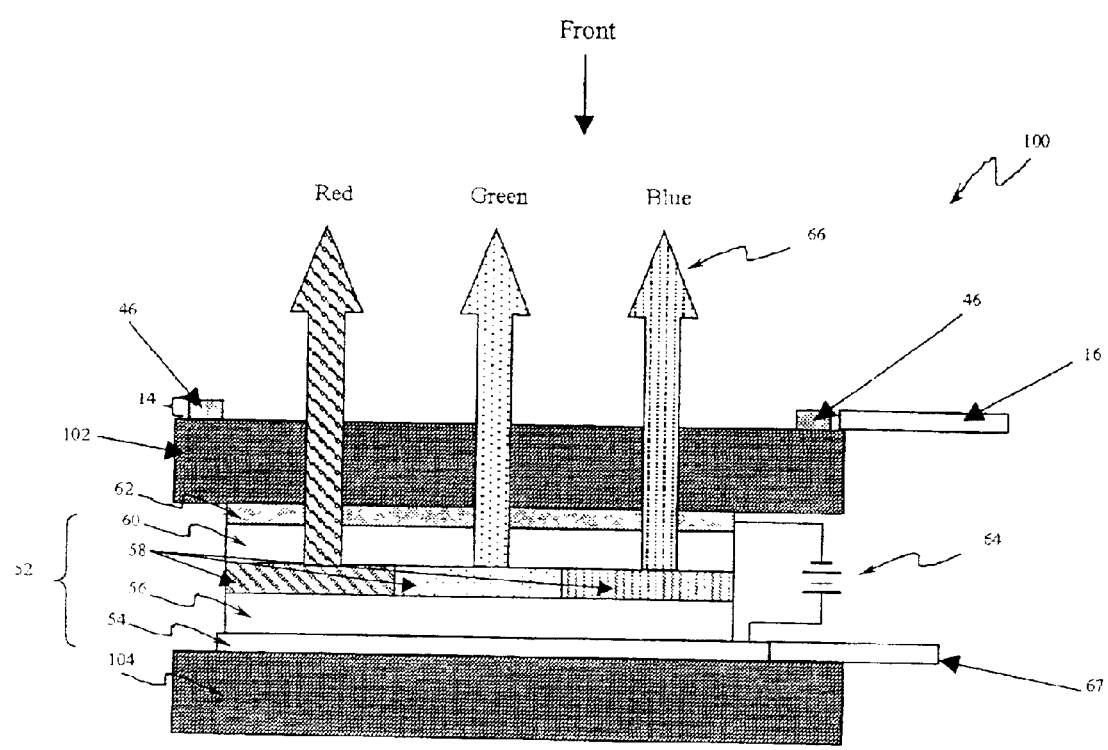
FIG. 15 is a schematic diagram showing an embodiment of the present invention with a surface acoustic wave touch screen utilizing a top-emitting structure.

FIG. 15 shows a top-emitting display 100 manufactured with a surface acoustic wave touch screen. According to one method of manufacturing, an image display 52 is formed on the opposite face of the substrate 104, started by forming metal interconnections 54. Then, a hole injection layer (HIL) 56 is applied to the device over the metal interconnections 54. Organic emitters 58 are then coated and patterned on top of the HIL layer 56. Next, an electron transport layer (ETL) 60 is deposited, followed by a semi-transparent or transparent metal cathode layer 62, completing the light emitting elements 52. After the deposition of the semi-transparent or transparent metal cathode layer 62, transparent sheet 102 is then sealed to substrate 104, encapsulating the touch screen display. Next, a series of acoustic surface wave reflectors 48 are etched into exposed face of transparent sheet 102. The touch screen elements 14 are then completed by forming four acoustic transducers 46 on the transparent sheet 102. Finally, a cable 67 is attached to the light emitting elements 52 of the image display, and a cable 16 is attached to the touch sensitive elements 14 of the touch screen, resulting in a fully manufactured touch screen display 100.

Alternatively, the organic electroluminescent display of FIG. 15 may be manufactured in a second manner, where the touch sensitive elements are placed on the transparent sheet 102 prior to encapsulation. In such a process, an image display 52 is formed on the opposite face of the substrate 104, started by forming metal interconnections 54. Then, a hole injection layer (HIL) 56 is applied to the device over the metal interconnections 54. Organic emitters 58 are then coated and patterned on top of the HIL layer 56. Next, an electron transport layer (ETL) 60 is deposited, followed by a semi-transparent or transparent metal cathode layer 62, completing the light emitting elements 52. Elsewhere, and typically prior to the above manufacturing steps, a series of acoustic surface wave reflectors 48 are etched into one face of transparent sheet 102. The touch screen elements 14 are then completed by forming four acoustic transducers 46 on the transparent sheet 102. After the deposition of the semi-transparent or transparent metal cathode layer 62, the transparent sheet 102 is then sealed to substrate 104, encapsulating the touch screen display. Note that the face of the transparent sheet containing the touch sensitive elements is placed away from the substrate 104. Finally, a cable 67 is attached to the light emitting elements 52 of the display, and a cable 16 is attached to the touch sensitive elements 14 of the touch screen, resulting in a fully manufactured touch screen display 100.

The invention has been described in detail with particular reference to certain preferred embodiments thereof, but it will be understood that variations and modifications can be effected within the spirit and scope of the invention. For example, U.S. Pat. No. 5,703,436 issued on Dec. 30, 1997, to Forrest et al. describes an OLED that can simultaneously emit light via both top-emitting and bottom-emitting mechanisms. Such a display can utilize the current invention by forming touch sensitive elements of a touch screen on either face, or both faces, of the OLED device, using the methods described herein. Such an integrated touch screen-OLED device falls under the scope of this invention. Additionally, U.S. Pat. No. 5,834,893 issued on Nov. 10, 1998, to Bulovic et al. describes an inverted OLED structure, in which a metal cathode is formed on the substrate and an anode is formed above the organic light emitting materials. Such an OLED structure can utilize the current invention by forming touch sensitive elements of a touch screen on either face of the OLED device, using the methods described herein. Such an integrated touch screen-OLED device falls under the scope of this invention.

Finally, it is understood that certain manufacturing process steps may be reordered, deleted, or inserted, based on the needs for a particular touch screen display device and for a particular method of fabrication. All such modifications that utilize the basic teachings disclosed here are within the spirit and scope of the present invention.

| PARTS LIST | |
|---|---|
| 10 | touch screen |
| 12 | substrate |
| 14 | touch sensitive elements |
| 16 | cable |
| 18 | controller |
| 20 | lower circuit layer |
| 22 | flexible spacer layer |
| 24 | spacer dot |
| 26 | flexible upper circuit layer |
| 28 | flexible top protective layer |
| 30 | metal oxide layer |
| 31 | circuitry |
| 32 | metal contact |
| 34 | metal contact |
| 36 | metal contact |
| 38 | metal contact |
| 46 | acoustic transducer |
| 48 | acoustic surface wave reflector |
| 49 | OLED flat panel display |
| 50 | substrate |
| 51 | cover sheet |

| -continued | |
|---|---|
| PARTS LIST | |
| 52 | light emitting elements |
| 54 | conductors |
| 56 | hole injection layer |
| 58 | organic light emitters |
| 60 | electron transport layer |
| 62 | cathode layer |
| 64 | voltage source |
| 66 | light |
| 67 | cable |
| 68 | frame |
| 72 | spacer |
| 100 | touch screen display |
| 102 | transparent sheet |
| 104 | substrate |

What is claimed is:

1. A method of manufacturing a touch screen display, comprising the steps of:

a) providing a transparent sheet having two opposite faces;

b) forming conductive layers on opposite faces of the transparent sheet;

c) patterning the respective conductive layers to form a lower circuit layer for resistive touch sensitive elements and metal interconnections for light emitting elements on opposite sides of the transparent sheet;

d) forming a hole injection layer over the metal interconnections;

e) depositing organic light emitters on the hole injection layer;

f) depositing an electron transport layer on the organic light emitters;

g) depositing a metal cathode layer on the electron transport layer;

h) placing a flexible spacer layer having a matrix of spacer dots onto the lower circuit layer;

i) attaching a flexible upper circuit layer over the spacer layer; and j) laminating a flexible top protective layer onto the upper circuit layer.

2. A method of manufacturing a touch screen display, comprising the steps of:

a) providing a transparent sheet having two opposite faces;

b) forming a pattern of transparent metal oxide on one of the faces of the transparent sheet for a capacitive sensing touch screen, the pattern having corners;

c) forming metal interconnections on the opposite face of the transparent sheet;

d) patterning the metal interconnections for light emitting elements;

e) forming a hole injection layer over the metal interconnections;

f) depositing organic light emitters on the hole injection layer;

g) depositing an electron transport layer on the organic light emitters;

h) depositing a metal cathode layer on the electron transport layer; and i) placing metal contacts on the corners of the transparent metal oxide layer.

3. A method of manufacturing a touch screen display, comprising the steps of:

a) providing a transparent sheet having opposite faces;
b) etching a pattern of surface acoustic wave reflectors into one face of the transparent sheet;
c) forming a conductive layer on the opposite face of the transparent sheet;
d) patterning the conductive layer to form metal interconnections for light emitting elements;
e) forming a hole injection layer over the metal interconnections;
f) depositing organic light emitters on the hole injection layer;
g) depositing an electron transport layer on the organic light emitters;
h) depositing a metal cathode layer on the electron transport layer; and
i) forming acoustic wave transducers on the one face of the substrate.

4. A method of manufacturing a touch screen display, comprising the steps of:
  a) providing a substrate having two opposite faces;
  b) forming a conductive layer on one face of the substrate;
  c) patterning the conductive layer to form metal interconnections for light emitting elements on the one face of the substrate;
  d) forming a hole injection layer over the metal interconnections;
  e) depositing organic light emitters on the hole injection layer;
  f) depositing an electron transport layer on the organic light emitters;
  g) depositing a semi-transparent or transparent metal cathode layer on the electron transport layer;
  h) encapsulating the organic electroluminescent display with a transparent sheet having two faces;
  i) forming a conductive layer on the face of the transparent sheet external to the organic electroluminescent display;
  j) patterning the conductive layer to form a lower circuit layer for resistive touch sensitive elements;
  k) placing a flexible spacer layer having a matrix of spacer dots onto the lower circuit layer;
  l) attaching a flexible upper circuit layer over the spacer layer; and
  m) laminating a flexible top protective layer onto the upper circuit layer.

5. A method of manufacturing a touch screen display, comprising the steps of:
  a) forming the light emitting elements of an electroluminescent display by:
    i) providing a substrate having two opposite faces;
    ii) forming a conductive layer on one face of the substrate;
    iii) patterning the conductive layer to form metal interconnections for light emitting elements on the one face of the substrate;
    iv) forming a hole injection layer over the metal interconnections;
    v) depositing organic light emitters on the hole injection layer;
    vi) depositing an electron transport layer on the organic light emitters; and
    vii) depositing a semi-transparent or transparent metal cathode layer on the electron transport layer;
  b) forming the touch sensitive elements of a resistive touch screen by:
    i) providing a transparent sheet with two opposite faces;
    ii) forming a conductive layer on one face of the transparent sheet;
    iii) patterning the conductive layer to form a lower circuit layer for resistive touch sensitive elements;
    iv) placing a flexible spacer layer having a matrix of spacer dots onto the lower circuit layer;
    v) attaching a flexible upper circuit layer over the spacer layer; and
    vi) laminating a flexible top protective layer onto the upper circuit layer.
  c) encapsulating the touch screen display with the transparent sheet, such that the light emitting materials are internal to the touch screen display and the touch sensitive elements are external to the touch screen display.

6. A method of manufacturing a touch screen display, comprising the steps of:
  a) providing a substrate having two opposite faces;
  b) forming a conductive layer on one face of the substrate;
  c) patterning the conductive layer to form metal interconnections for light emitting elements on opposite sides of the substrate;
  d) forming a hole injection layer over the metal interconnections;
  e) depositing organic light emitters on the hole injection layer;
  t) depositing an electron transport layer on the organic light emitters;
  g) depositing a semi-transparent or transparent metal cathode layer on the electron transport layer;
  h) encapsulating the touch screen display with a transparent sheet having two faces;
  i) forming a pattern of transparent metal oxide on the face of the transparent sheet external to the touch screen display for a capacitive sensing touch screen, the pattern having corners; and
  j) placing metal contacts on the corners of the transparent metal oxide layer.

7. A method of manufacturing a touch screen display, comprising the steps of:
  a) forming the light emitting elements of an electroluminescent display by:
    i) providing a substrate having two opposite faces;
    ii) forming a conductive layer on one face of the substrate;
    iii) patterning the conductive layer to form metal interconnections for light emitting elements on opposite sides of the substrate;
    iv) forming a hole injection layer over the metal interconnections;
    v) depositing organic light emitters on the hole injection layer;
    vi) depositing an electron transport layer on the organic light emitters; and
    vii) depositing a semi-transparent or transparent metal cathode layer on the electron transport layer;
  b) forming the touch sensitive elements of a capacitive sensing touch screen by:
    i) providing a transparent sheet having two opposite faces;
    ii) forming a pattern of transparent metal oxide on one face of the top transparent material, the pattern having corners; and iii) placing metal contacts on the corners of the transparent metal oxide layer;

c) encapsulating the touch screen display with the transparent sheet, such that the light emitting materials are internal to the touch screen display and the touch sensitive elements are external to the touch screen display.

8. A method of manufacturing a touch screen display, comprising the steps of:
   a) providing a substrate having opposite faces;
   b) forming a conductive layer on one face of the substrate;
   c) patterning the conductive layer to form metal interconnections for light emitting elements;
   d) forming a hole injection layer over the metal interconnections;
   e) depositing organic light emitters on the hole injection layer;
   f) depositing an electron transport layer on the organic light emitters;
   g) depositing a semi-transparent or transparent metal cathode layer on the electron transport layer;
   h) encapsulating the touch screen display with a transparent sheet having two faces;
   h) etching a pattern of surface acoustic wave reflectors into the face of the transparent sheet external to the touch screen display; and
   i) forming acoustic wave transducers on the one face of the transparent sheet.

9. A method of manufacturing a touch screen display, comprising the steps of:
   a) forming the light emitting elements of an electroluminescent display by:
      i) providing a substrate having opposite faces;
      ii) forming a conductive layer on one face of the substrate;
      iii) patterning the conductive layer to form metal interconnections for light emitting elements;
      iv) forming a hole injection layer over the metal interconnections;
      v) depositing organic light emitters on the hole injection layer;
      vi) depositing an electron transport layer on the organic light emitters; and
      vii) depositing a semi-transparent or transparent metal cathode layer on the electron transport layer;
   b) forming the touch sensitive elements of a surface acoustic wave touch screen by:
      i) etching a pattern of surface acoustic wave reflectors into one face of a transparent sheet; and
      ii) forming acoustic wave transducers on the one face of the transparent sheet.
   c) encapsulating the touch screen display with the transparent sheet, such that the light emitting materials are internal to the touch screen display and the touch sensitive elements are external to the touch screen display.

* * * * *